(12) United States Patent
Lin et al.

(10) Patent No.: US 7,314,828 B2
(45) Date of Patent: Jan. 1, 2008

(54) REPAIRING METHOD FOR LOW-K DIELECTRIC MATERIALS

(75) Inventors: Keng-Chu Lin, Ping-Tung (TW); Chen-Hua Yu, Hsin-Chu (TW); Ching-Ya Wang, Taipei (TW); Chia-Cheng Chou, Keelung (TW); Tien-I Bao, Hsin-Chu (TW); Shwang-Ming Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 11/184,589

(22) Filed: Jul. 19, 2005

(65) Prior Publication Data

US 2007/0020952 A1 Jan. 25, 2007

(51) Int. Cl.
*H01L 21/4763* (2006.01)
(52) U.S. Cl. .............................. 438/637; 257/E21.577; 257/E21.585; 438/675
(58) Field of Classification Search ................ 438/680, 438/623, 633, 638, 634, 640, 783, 637, 675; 257/E21.577, E21.585
See application file for complete search history.

(56) References Cited

U.S. PATENT DOCUMENTS

| | | | |
|---|---|---|---|
| 6,171,951 B1 * | 1/2001 | Lee et al. ................... 438/640 |
| 6,962,869 B1 * | 11/2005 | Bao et al. ................... 438/623 |
| 7,098,149 B2 * | 8/2006 | Lukas et al. ................ 438/778 |
| 2004/0087143 A1 * | 5/2004 | Norman et al. ............. 438/680 |
| 2004/0175958 A1 | 9/2004 | Lin et al. |
| 2004/0192572 A1 * | 9/2004 | Peters ........................ 510/412 |
| 2005/0095840 A1 * | 5/2005 | Bhanap et al. ............. 438/623 |
| 2005/0279381 A1 * | 12/2005 | Masuda et al. ................ 134/2 |
| 2006/0040840 A1 * | 2/2006 | Korzenski et al. .......... 510/175 |
| 2006/0055004 A1 * | 3/2006 | Gates et al. ................ 257/632 |
| 2006/0216952 A1 * | 9/2006 | Bhanap et al. ............. 438/780 |

* cited by examiner

*Primary Examiner*—Asok Kumar Sarkar
(74) *Attorney, Agent, or Firm*—Slater & Matsil, L.L.P.

(57) ABSTRACT

A method of forming a low-k dielectric layer and forming a structure in the low-k dielectric layer includes depositing a low-k dielectric layer over a substrate, performing a first treatment to the low-k dielectric layer, performing post-formation processes, and performing a second treatment to the low-k dielectric layer. The k value of the low-k dielectric layer is lowered by the first treatment. The post-formation processes performed to the low-k dielectric layer include at least one low-k dielectric material damaging process. The second treatment restores the low-k dielectric layer. Preferably, each of the first and second treatments includes a curing process selected from e-beam curing, ultraviolet curing, plasma curing, $SCCO_2$ cleaning, and combinations thereof.

16 Claims, 3 Drawing Sheets

US 7,314,828 B2

REPAIRING METHOD FOR LOW-K DIELECTRIC MATERIALS

TECHNICAL FIELD

This invention relates generally to semiconductor device manufacturing, and more particularly to formation and processing of porous, low-k dielectrics.

BACKGROUND

As the density of semiconductor devices increases and as the size of circuit elements becomes smaller, resistance-capacitance (RC) delay time increasingly affects integrated circuit performance. Low-k dielectrics, therefore, are used to reduce the RC delay. Low-k dielectrics are particularly useful as inter-layer dielectrics and inter-metal dielectrics. However, low-k dielectrics present problems during processing, especially during the fabrication of the conductive material used to make interconnects.

After formation, low-k dielectric materials typically go through various post-formation processes, such as etching, ashing, wet cleaning, chemical mechanical polishing, etc., and the properties of the low-k dielectric materials are adversely affected. For example, due to the chemicals used, contamination may occur. When there is an open pore in the dielectric material, processing fluids can enter the pores, thereby causing corrosion, mechanical damage, or an increase in the dielectric constant. Additionally, materials involved in the etching and ashing processes, such as fluorine and nitrogen, enter the porous dielectric films and further damage low-k dielectric materials. Pore damage may also cause a surface that is preferably hydrophobic to become hydrophilic.

Chemicals used in the post-formation processes cause bonds between the low-k dielectric elements to break, thus degrading the mechanical strength of the low-k dielectric materials. Missing bonds also destabilize the low-k dielectric materials, since undesired elements may form bonds with the low-k dielectric materials, causing a decrease in mechanical strength and an increase in the k value. It has been found that a low-k dielectric film having a k value of about 2.56 and a hardness of about 1.4 GPa after its formation will have a k value of about 3.02 and a hardness of about 1.1 GPa after etching, ashing, and chemical mechanical polishing.

Due to the previously discussed reasons, after the post-formation processes, the low-k dielectric materials need to be restored. However, baking processes, which are typically used in existing IC manufacturing, can only remove moisture trapped in the low-k dielectric films, but can neither repair damage nor remove fluorine and nitrogen from the low-k dielectric films.

Therefore, there is the need for a method to restore the low-k dielectric films by removing contaminators and repairing bonds.

SUMMARY OF THE INVENTION

The preferred embodiments of the present invention provide a method of forming a low-k dielectric layer and forming a structure in the low-k dielectric layer.

In accordance with one aspect of the present invention, the method includes depositing a low-k dielectric layer over a substrate, performing a first treatment to the low-k dielectric layer, performing post-formation processes, such as forming a via in the low-k dielectric layer, and performing a second treatment to the low-k dielectric layer.

The first treatment includes a curing process and optionally an $SCCO_2$ cleaning, wherein the curing process is preferably an e-beam curing, an ultraviolet curing, a plasma curing, or combinations thereof. The k value of the low-k dielectric layer is further lowered by the first treatment.

The post-formation processes performed to the low-k dielectric layer include at least one low-k dielectric material damaging process, such as etching, ashing, wet cleaning, reactive pre-cleaning, chemical mechanical polishing, and combinations thereof. Therefore, the second treatment restores the low-k dielectric layer. Preferably, the second treatment includes a curing process selected from e-beam curing, ultraviolet curing, plasma curing, and combinations thereof.

In accordance with another aspect of the present invention, the second treatment further includes an $SCCO_2$ cleaning to remove undesired reaction residues, such as fluorine and nitrogen, from the low-k dielectric layer.

In accordance with yet another aspect of the present invention, the curing process of the second treatment is performed with the presence of a precursor, which is carried into the low-k dielectric material by $SCCO_2$. Preferably, the precursor includes organic materials in the silane group such as DEMS and 3MS, and/or carbon and hydrogen containing materials, often represented by $C_xH_y$.

The advantageous features of the preferred embodiments of the present invention include restoring the structure of the low-k material, lowering the k value, increasing mechanical strength, and removing contamination.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In semiconductor integrated circuit manufacturing processes, semiconductor devices are formed in or on a substrate. Conductive lines are then used to interconnect devices. Conductive lines may be formed in different layers and separated by dielectric layers, such as inter-layer dielectrics (ILD), and inter-metal dielectrics (IMD), and are interconnected by vias. The dielectric layers preferably have low k values, so that parasitic capacitances between the conductive lines are low. FIGS. 1 through 4 illustrate cross-sectional views of intermediate stages in the manufacture of a via in a low-k dielectric layer. The cross-sectional views are taken in a plane perpendicular to the length direction of the conductive lines formed. Therefore, conductive lines appear to be rectangles.

Figure 1:
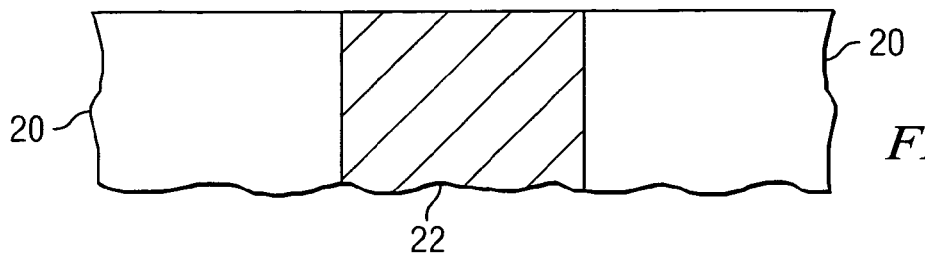
FIGS. 1 through 4 are cross-sectional views of intermediate stages in the manufacture of a preferred embodiment, wherein a via is formed after the formation of a low-k dielectric layer.

FIG. 1 illustrates a portion of a wafer having a conductive line 22 formed in a dielectric layer 20. The conductive line 22 is preferably a metal comprising copper, tungsten, aluminum, silver, gold, alloys thereof, compounds thereof, and combinations thereof. It can also be formed of other materials such as doped polysilicon. The conductive line 22 is typically connected to another feature (not shown), such as a via or a contact plug. The dielectric layer 20 is preferably an inter-layer dielectric (ILD) layer, or an inter-metal dielectric (IMD) layer.

Figure 2A:
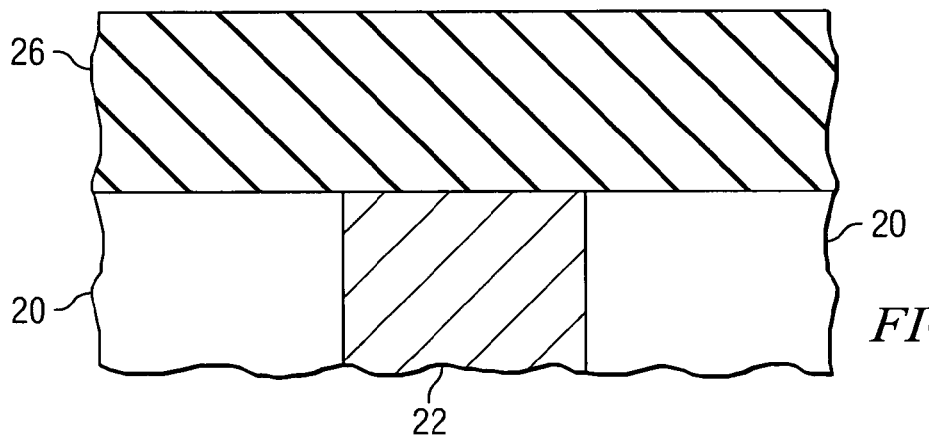

A dielectric layer 26 is formed on the conductive line 22 and the dielectric layer 20, as shown in FIG. 2A. The dielectric layer 26 provides insulation between the conductive line 22 and overlying conductive lines that will be formed subsequently. The dielectric layer 26 has a low dielectric constant value (k), preferably lower than about 3.5, and more preferably lower than about 3.0. The dielectric layer 26 may be deposited using, e.g., tetraethyl orthosilicate (TEOS), chemical vapor deposition (CVD), plasma enhanced CVD (PECVD), low pressure CVD (LPCVD), or other well-known deposition techniques. The dielectric layer 26 may comprise porogen-containing materials, such as (CVD) BDIIx from Applied Materials and (spin-on) Xerogel, or non-porogen-containing materials, such as (CVD) Black Diamond® from Applied Materials and (spin-on) SiLK® from Dow Chemical.

Figure 2B:
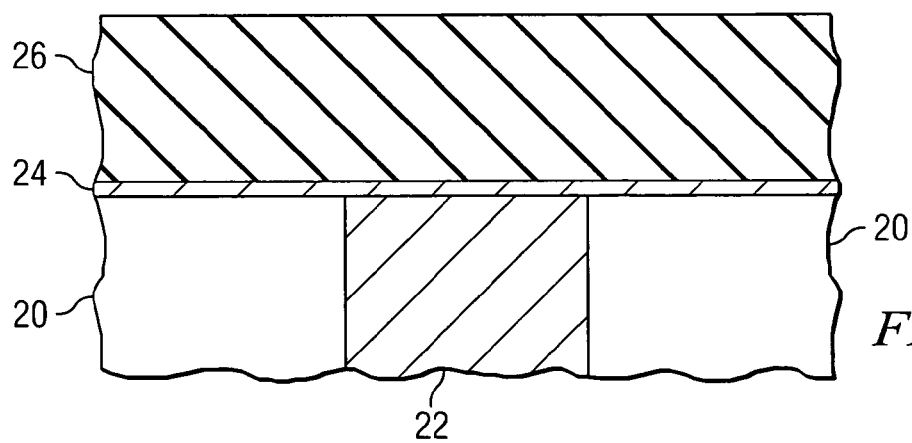

In the preferred embodiment, the dielectric layer 26 preferably has different etching characteristics from the conductive line 22, thus the conductive line 22 acts as an etch stop layer in subsequent etching processes of the dielectric layer 26. In alternative embodiments, as shown in FIG. 2B, an etch stop layer (ESL) 24 is formed on the conductive line 22 and the dielectric layer 20. Preferably, the ESL 24 comprises dielectric materials, such as nitride, SiCN, SiCO, and the like.

A first treatment is then performed, for preferably two purposes. First, at least one curing process to lower the k value of the dielectric layer 26 and second, an optional cleaning to remove undesired reaction residues from the porous dielectric layer 26.

Preferably, the curing process can be performed using commonly used curing methods, such as e-beam curing, ultraviolet curing, plasma curing, and the like, and may be performed in a production tool that is also used for PECVD, atomic layer deposition (ALD), selective area CVD (SACVD) or LPCVD. More than one curing method can be combined to achieve better effects.

When plasma curing is performed, the wafer is exposed to plasma. Plasma can be generated using mechanisms such as radio frequency (RF) and microwave electron cyclotron resonance (ECR). The exact conditions for the plasma curing depend upon what type of plasma is being used. An example of typical microwave plasma curing conditions is shown below.

Microwave plasma power: 10 W-3000 W
Wafer temperature: 200° C.-500° C.
Process pressure: 0.1 Torr-100 Torr
Plasma cure time: <1800 seconds
Plasma gases: $H_2$, He, Ar, and combination thereof
$H_2$/He/Ar/flow rate: >0-10000 sccm In an embodiment where ultraviolet curing is performed, an ultraviolet radiator tool is utilized, and the ultraviolet curing can occur at vacuum conditions, or at conditions without the presence of oxygen or oxidizing gases. An exemplary ultraviolet curing setting has parameters as follows:

Temperature: 200° C.-500° C.
Cure Time: <1800 seconds
Process gases: Argon/$H_2$/He, and organic silane or $C_xH_y$.

The e-beam curing processes can be carried out with an accelerating voltage of about 1.0 to about 8.0 keV, a wafer temperature of about 400° C., and a pressure of about 10 Torr in a chamber.

The curing process drives out porogen (if the low-k dielectric layer 26 is porogen-containing) and lowers the k value of the low-k dielectric layer 26.

In addition to the curing processes, the first treatment preferably includes cleaning processes to remove residues introduced during previously discussed steps. The cleaning processes are preferably performed using super critical carbon dioxide ($SCCO_2$). $SCCO_2$ has strong dissolving capacity, particularly for organic substances. Also, the $SCCO_2$ liquid has near zero surface tension, and can penetrate small pores easily. The $SCCO_2$ cleaning is preferably performed in a chamber in which the previously discussed wafer comprising a low-k dielectric material is placed. At a temperature of about 70° C., and a pressure of about 1000 atmospheres, $CO_2$ is in a critical state and becomes $SCCO_2$, which then enters the pores of the low-k dielectric layer 26 and dissolves undesired materials, such as fluorine and nitrogen. The sample is then drained, and the undesired materials are removed from the low-k dielectric material along with the $SCCO_2$.

Figure 3A:
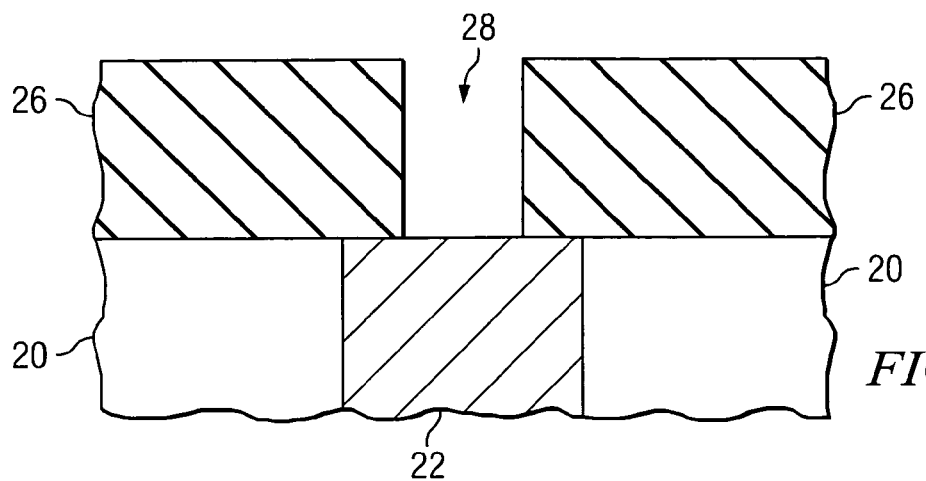
Figure 3B:
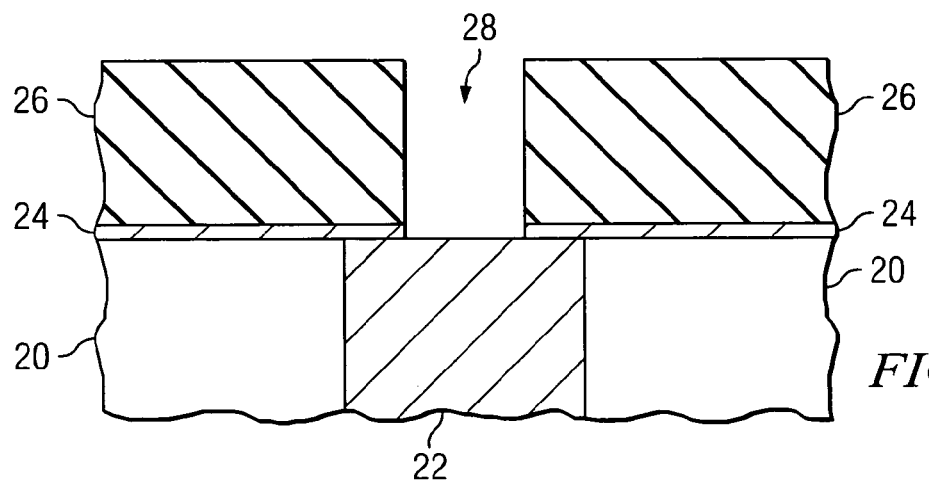

FIGS. 3A and 3B illustrate the formation of a via opening 28. As is known in the art, a photo resist (not shown) is formed and patterned over the dielectric layer 26 to mask the regions to be protected. In the preferred embodiment, as shown in FIG. 3A, the via opening 28 is formed by etching the dielectric layer 26. In other embodiments, ashing can be used. The etching/ashing processing stops at the conductive line 22. If the ESL 24 exists, as shown in FIG. 3B, the low-k dielectric layer 26 is etched, stopping at the ESL 24, which protects the underlying conductive line 22 from being over etched. Next, the exposed portion of the ESL 24 is etched. Because the ESL 24 is quite thin relative to the dielectric layer 26, process control and end-point detection are much more closely controlled, thus limiting the likelihood of over-etching through the underlying conductive line 22.

Figure 4:
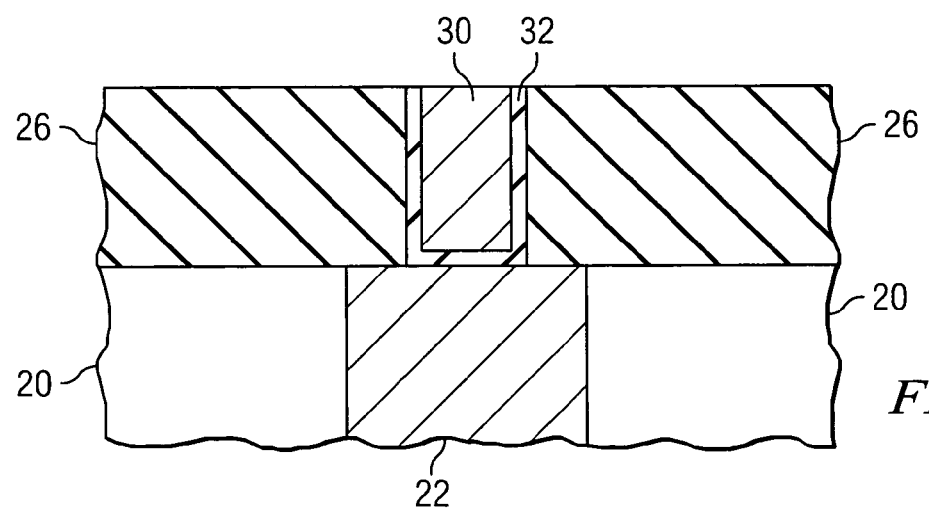

Referring to FIG. 4, the via opening 28 is filled, forming a via 30. In the preferred embodiment, the filling material comprises metals such as copper, aluminum, tungsten, silver, gold, combinations and/or other well-known alternatives. In other embodiments, the via 30 comprises doped polysilicon. Preferably, the via 30 has a composite structure, including a barrier layer 32 formed of a material comprising materials such as titanium, titanium nitride, tantalum, tantalum nitride, silicon carbide, silicon oxycarbide, and the like. The barrier layer 32 prevents the via material, particularly copper, from diffusing into the low-k dielectric layer 26 and causing circuit failure. A chemical mechanical polish is then performed to remove excess materials.

A second treatment is then performed, which preferably includes curing processes. The post-formation processes, such as etching, ashing, and chemical mechanical polishing damage the bonds and lower the mechanical strength of the low-k dielectric layer 26. The k value of the low-k dielectric layer 26 also increases. Therefore, curing processes help restore the low-k dielectric layer 26. Preferably, e-beam curing, ultraviolet curing, plasma curing, and combinations thereof can be used.

Preferably, and particularly for an organic low-k dielectric layer 26, the curing processes are preferably performed with an organic precursor in the silane group, such as $(CH_3)_3SiH$ (also known as 3MS or trimethylsilane) and/or $Si(OC_2H_5)_2(CH_3)H$ (also known as DEMS), and the like. Other materials comprising carbon and hydrogen, often expressed as $C_xH_y$, can also be used as the precursor. The precursors supply carbon and hydrogen that are comprised in $CH_3$, which is useful for restoring the bonds of the low-k materials. DEMS and 3MS are preferably carried into the pores of the low-k dielectric materials and an exemplary process is described as follows: $CO_2$, DMES and/or 3MS, and wafers including a low-k dielectric material are co-placed in a chamber. The temperature and pressure in the chamber are adjusted so that $SCCO_2$ is formed. DEMS and 3MS dissolve in the $SCCO_2$, and enter the low-k dielectric material along with the $SCCO_2$. The pressure and temperature in the chamber are then changed and the $SCCO_2$ changes to a gas state, evaporating from the pores, leaving DEMS and/or 3MS in the low-k dielectric material. Since the $SCCO_2$ can penetrate very small pores, the distribution of the DEMS and 3MS in the low-k dielectric material is relatively uniform. The DEMS and 3MS are then activated by the curing processes, which break the bonding of $CH_3$ from DEMS and 3MS, so that $CH_3$ can form bonds with the low-k dielectric material.

During the processes of etching and ashing, and the processes for forming the via 30, the low-k dielectric layer 26 is typically contaminated by chemicals. For example, dry etching typically introduces fluorine into the low-k dielectric material due to the use of CF, and wet etching typically introduces nitrogen. Fluorine and nitrogen form bonds with the low-k dielectric material, affecting the characteristics of the low-k dielectric material, and also increasing the k value. Additionally, dangling bonds exist on the edges of the pores, and nitrogen and fluorine readily form bonds with the dangling bonds.

The curing process helps break the bonds between fluorine and nitrogen and the low-k dielectric material and replaces them with desired elements such as $CH_3$. Further $SCCO_2$ cleaning is preferably performed to remove fluorine, nitrogen, and moisture out of the low-k dielectric layer 26. Other by-product residues, such as polymers, are also removed. If necessary, more than one curing process and more than one $SCCO_2$ cleaning can be performed.

Although the preferred embodiments of the present invention include two treatments that have similar processes, the two treatments are preferably not to be combined. One of the reasons is that the post-formation process may seal the surface of the low-k dielectric, at least partially, so that the curing processes in the second treatment cannot effectively lower the k value of the low-k dielectric material.

The preferred embodiments of the present invention are not limited to the processes involving the formation of vias. As many semiconductor fabrication processes, such as epitaxial growth and film deposition, include low-k dielectric damaging processes, low-k dielectric material restoration may be performed after these semiconductor fabrication processes.

Figure 5:
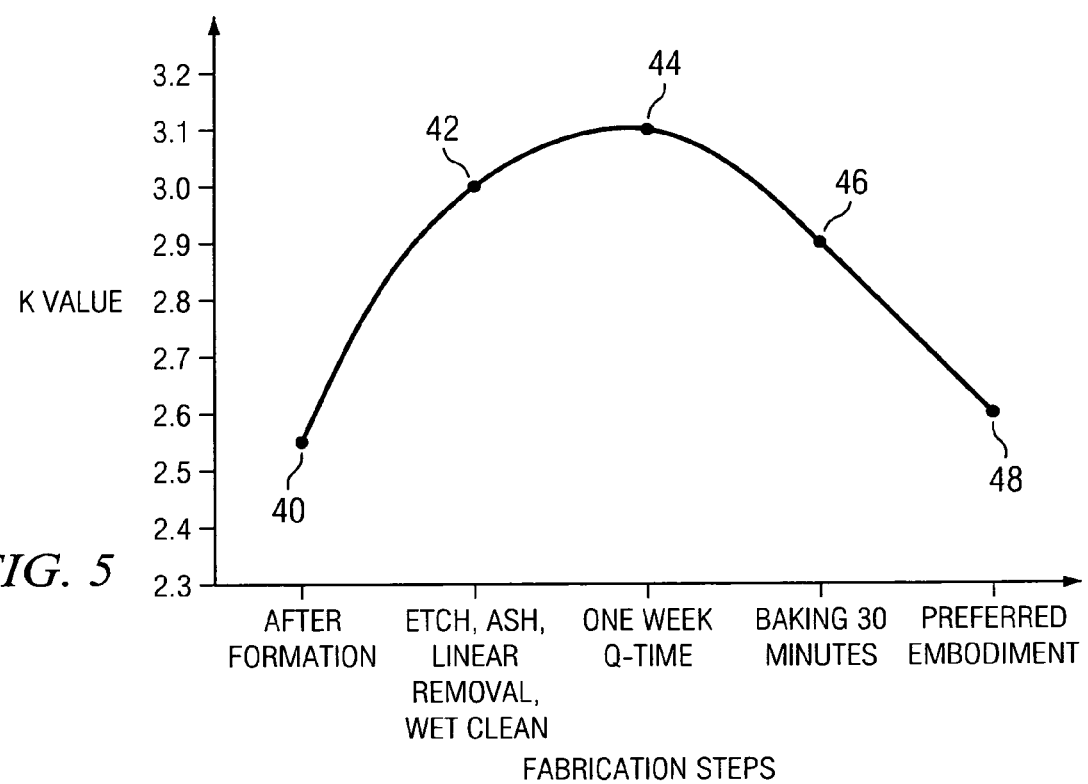
FIG. 5 illustrates changes in k values of a low-k dielectric material as a function of fabrication steps in the manufacture of the preferred embodiment.
Figure 6:
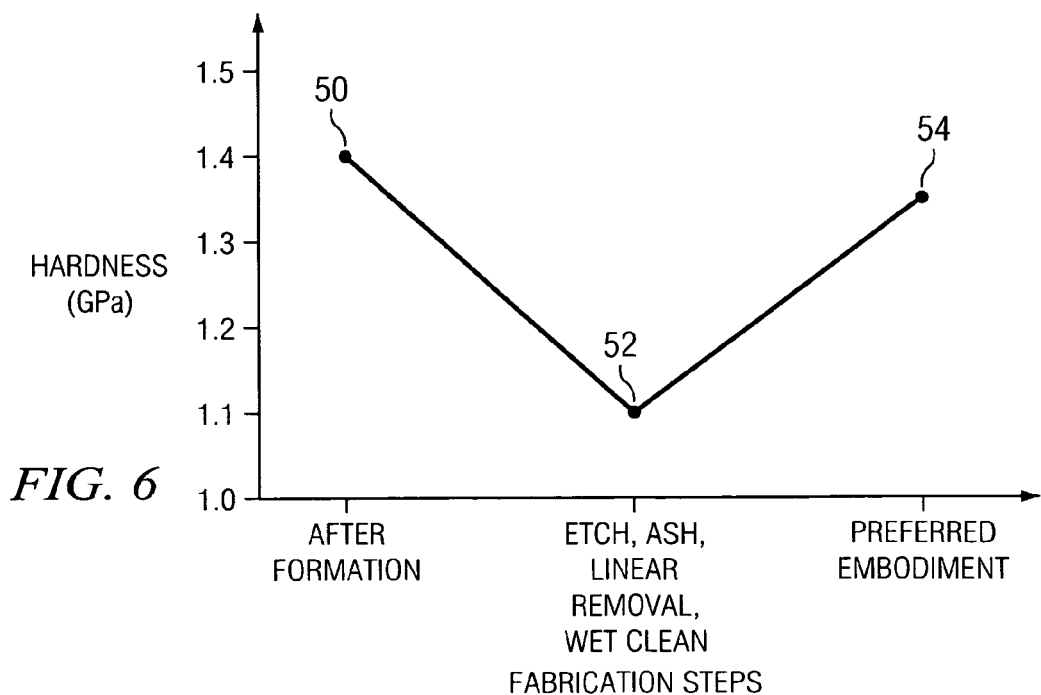
FIG. 6 illustrates changes in hardness values of a low-k dielectric material as a function of fabrication steps in the manufacture of the preferred embodiment.

The preferred embodiments of the present invention significantly improve the characteristics of the low-k dielectric material. FIGS. 5 and 6 illustrate measured k values and hardness values on sample devices, respectively. Referring to FIG. 5, after formation (point 40), the sample devices have a k value of 2.56, after etching, ashing and linear removal processes (point 42), the k value increases to about 3.02. The k value further increases to 3.09 after one week Q-time (point 44), which is a wait time before the next process step. Baking the sample devices for 30 minutes only brings the k value back to about 2.93 (point 46). However, by using the preferred embodiments of the present invention with ultraviolet or e-beam curing (point 48), the k value decreases to about 2.60, close to its post-formation value.

The hardness values of the samples experience similar improvement. Referring to FIG. 6, after formation (point 50), the sample devices have a hardness value of about 1.4 GPa. After etching, ashing and linear removal processes (point 52), the hardness value decreases to about 1.1 GPa. The preferred embodiments of the present invention, however, increase the hardness value of the samples to about 1.36 GPa (point 54), close to its post-formation value.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   depositing a low-k dielectric layer over a substrate;
   performing a first treatment to the low-k dielectric layer;
   performing processing steps comprising at least one low-k dielectric damaging process; and
   performing a second treatment to the low-k dielectric layer after the step of performing the at least one low-k dielectric damaging process, wherein the second treatment comprises a step of ultraviolet curing to restore the low-k dielectric layer.

2. The method of claim 1 wherein the low-k dielectric layer has a k value of less than about 3.5.

3. The method of claim 1 wherein the low-k dielectric damaging process is selected from the group consisting essentially of etching, ashing, wet cleaning, reactive pre-cleaning, chemical mechanical polishing, and combinations thereof.

4. The method of claim 1 wherein the step of performing the first treatment comprises a step selected from the group consisting essentially of e-beam curing, ultraviolet curing, plasma curing, $SCCO_2$ cleaning, and combinations thereof.

5. The method of claim 1 further comprising using $SCCO_2$ to carry a precursor into the low-k dielectric layer after the at least one low-k dielectric damaging process, wherein the precursor is activated by the step of ultraviolet curing.

6. The method of claim 5 wherein the precursor comprises a material in silane group.

7. The method of claim 6 wherein the precursor comprises a material selected from the group consisting essentially of DEMS, 3MS, and combinations thereof.

8. The method of claim 5 wherein the precursor comprises a carbon and hydrogen containing material.

9. The method of claim 1, wherein the second treatment is a curing process, and wherein the method further comprises a $SCCO_2$ cleaning after the curing process.

10. A method of forming a semiconductor structure, the method comprising:
   depositing a low-k dielectric layer over a substrate;
   performing a first treatment to the low-k dielectric layer;
   forming an opening in the low-k dielectric layer;
   filling the opening with a conductive material;
   placing the semiconductor structure in a chamber, wherein the chamber contains carbon dioxide and a precursor for restoring the low-k dielectric layer;
   adjusting at least one of a temperature and a pressure in the chamber to convert carbon dioxide into $SCCO_2$, wherein the precursor is dissolved in the $SCCO_2$, and wherein $SCCO_2$ carries the precursor into pores of the low-k dielectric layer;
   evaporating $SCCO_2$ from the low-k dielectric layer and leaving the precursor in the pores; and
   performing a second treatment to activate the precursor for restoring the low-k dielectric layer, the second treatment being performed after the filling.

11. The method of claim 10 wherein the step of performing the first treatment comprises a step selected from the group consisting essentially of e-beam curing, ultraviolet curing, $SCCO_2$ cleaning, and combinations thereof.

12. The method of claim 10 wherein the step of performing the second treatment comprises a step selected from the group consisting essentially of e-beam curing, ultraviolet curing, $SCCO_2$ cleaning, and combinations thereof.

13. The method of claim 10 wherein the step of forming the opening comprises a step selected from the group consisting essentially of etching and ashing.

14. The method of claim 10 wherein the step of filling the opening comprises a method selected from the group consisting essentially of wet cleaning, reactive-pre-cleaning, chemical mechanical polishing, and combinations thereof.

15. A method of forming a semiconductor structure, the method comprising:
   depositing a low-k dielectric layer over a substrate;
   performing a treatment to the low-k dielectric layer;
   forming an opening in the low-k dielectric layer;
   filling the opening with a conductive material;
   using $SCCO_2$ to carry precursors into pores of the low-k dielectric layer after the filling; and
   performing a restoration to the low-k dielectric layer after the step of carrying the precursors into the pores of the low-k dielectric layer.

16. The method of claim 15, wherein the precursors comprise a material selected from the group consisting essentially of DEMS, 3MS, and combinations thereof.

* * * * *

UNITED STATES PATENT AND TRADEMARK OFFICE
CERTIFICATE OF CORRECTION

PATENT NO. : 7,314,828 B2 Page 1 of 1
APPLICATION NO. : 11/184589
DATED : January 1, 2008
INVENTOR(S) : Lin et al.

It is certified that error appears in the above-identified patent and that said Letters Patent is hereby corrected as shown below:

On the title page, item (75), Inventors:, delete "Shwang-Ming Cheng," and insert --Shwang-Ming Jeng--.

Signed and Sealed this

Twenty-ninth Day of April, 2008

JON W. DUDAS
*Director of the United States Patent and Trademark Office*